(12) United States Patent
Ha et al.

(10) Patent No.: US 10,873,046 B2
(45) Date of Patent: Dec. 22, 2020

(54) DISPLAY DEVICE WITH ENCAPSULATION LAYER WITH VARYING RATIOS OF CARBON TO SILICON AND OXYGEN TO SILICON AND METHOD OF FABRICATING THE SAME

(71) Applicant: SAMSUNG DISPLAY CO., LTD., Yongin-si (KR)

(72) Inventors: Jaeheung Ha, Suwon-si (KR); Jongwoo Kim, Gwangmyeong-si (KR); Byoungduk Lee, Seongnam-si (KR); Seungjae Lee, Seoul (KR); Yoonhyeung Cho, Yongin-si (KR); Youngcheol Joo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/703,593

(22) Filed: Dec. 4, 2019

(65) Prior Publication Data

US 2020/0119301 A1 Apr. 16, 2020

Related U.S. Application Data

(62) Division of application No. 15/846,015, filed on Dec. 18, 2017, now Pat. No. 10,529,940.

(30) Foreign Application Priority Data

Apr. 3, 2017 (KR) .................. 10-2017-0043117

(51) Int. Cl.
*H01L 51/50* (2006.01)
*B32B 27/06* (2006.01)
(Continued)

(52) U.S. Cl.
CPC .......... *H01L 51/5012* (2013.01); *B32B 27/06* (2013.01); *C23C 14/325* (2013.01);
(Continued)

(58) Field of Classification Search
CPC ................................................ H01L 51/5012
See application file for complete search history.

(56) References Cited

U.S. PATENT DOCUMENTS 6,787,796 B2  9/2004  Do et al.
7,696,687 B2  4/2010  Lee et al.
(Continued)

FOREIGN PATENT DOCUMENTS

KR   100493322   6/2005
KR   100581850   5/2006
(Continued)

OTHER PUBLICATIONS

D. Hegemann, U. Vohrer, C. Oehr, R. Riedel, Deposition of SiOx films from O2/HMDSO plasmas, Surface and Coatings Technology, vols. 116-119, 1999, pp. 1033-1036. (Year: 1999).*

(Continued)

*Primary Examiner* — Nduka E Ojeh
*Assistant Examiner* — Laura M Dykes
(74) *Attorney, Agent, or Firm* — F. Chau & Associates, LLC

(57) ABSTRACT

A display device includes a organic light emitting device and an encapsulation structure disposed on the organic light emitting device that seals the organic light emitting device. The encapsulation structure includes a first inorganic encapsulation layer disposed on the organic light emitting device, an organic layer disposed on the first inorganic encapsulation layer, and a second inorganic encapsulation layer disposed on the organic layer. The organic layer includes a first organic layer disposed on the first inorganic encapsulation
(Continued)

layer and a second organic layer disposed on the first organic layer. An atomic ratio of carbon to silicon in the first organic layer is less than an atomic ratio of carbon to silicon in the second organic layer.

6 Claims, 13 Drawing Sheets

(51) Int. Cl.

| | | |
|---|---|---|
| C23C 14/32 | (2006.01) | |
| H01L 51/52 | (2006.01) | |
| H01L 31/049 | (2014.01) | |
| C23C 14/54 | (2006.01) | |
| C23C 16/32 | (2006.01) | |
| C23C 16/40 | (2006.01) | |
| H01L 27/32 | (2006.01) | |

(52) U.S. Cl.
CPC .......... *C23C 14/548* (2013.01); *C23C 16/325* (2013.01); *C23C 16/401* (2013.01); *H01L 31/049* (2014.12); *H01L 51/524* (2013.01); *H01L 51/5256* (2013.01); *H01L 27/3244* (2013.01); *Y02E 10/50* (2013.01)

(56) References Cited

U.S. PATENT DOCUMENTS

| | | |
|---|---|---|
| 8,461,760 B1 | 6/2013 | Oh et al. |
| 8,759,822 B2 | 6/2014 | Lee et al. |
| 9,331,311 B2 | 5/2016 | Chen |
| 9,397,318 B2 | 7/2016 | Chen et al. |
| 9,425,428 B2 | 8/2016 | Jung et al. |
| 9,431,631 B2 | 8/2016 | Chen et al. |
| 9,449,809 B2 | 9/2016 | Choi et al. |
| 9,660,208 B2 | 5/2017 | Yamada |
| 9,761,836 B2 | 9/2017 | Chen |
| 2006/0158101 A1 | 7/2006 | Camilletti et al. |
| 2008/0074042 A1 | 3/2008 | Itai |
| 2009/0297813 A1 | 12/2009 | Erlat et al. |
| 2012/0267646 A1 | 10/2012 | Kim |
| 2014/0299859 A1 | 10/2014 | Chen et al. |
| 2014/0349422 A1 | 11/2014 | Chen et al. |
| 2015/0108442 A1* | 4/2015 | Kim ............... H01L 51/5253 257/40 |
| 2016/0095172 A1 | 3/2016 | Lee et al. |
| 2016/0118628 A1 | 4/2016 | Kang et al. |
| 2018/0287085 A1 | 10/2018 | Ha et al. |

FOREIGN PATENT DOCUMENTS

| | | |
|---|---|---|
| KR | 100852110 | 8/2008 |
| KR | 20130128689 | 11/2013 |
| KR | 20140013514 | 2/2014 |
| KR | 20140087470 | 7/2014 |
| KR | 20140106567 | 9/2014 |
| KR | 101560234 | 10/2015 |
| KR | 20160049157 | 5/2016 |
| KR | 1020160065436 | 6/2016 |
| KR | 20160103589 | 9/2016 |

OTHER PUBLICATIONS

Pietro Favia, et al., "Plasma and Surface Diagnostics in PECVD From Silicon Containing Organic Monomers," Pure & Appl. Chem. vol. 66, No. 6, pp. 1373-1380, 1994.

* cited by examiner

DISPLAY DEVICE WITH ENCAPSULATION LAYER WITH VARYING RATIOS OF CARBON TO SILICON AND OXYGEN TO SILICON AND METHOD OF FABRICATING THE SAME

CROSS-REFERENCE TO RELATED APPLICATIONS

This U.S. non-provisional patent application is a divisional of U.S. application Ser. No. 15/846,015, filed on Dec. 18, 2017 in the U.S. Patent and Trademark Office, which claims priority under 35 U.S.C. § 119 from, and the benefit of, Korean Patent Application No, 10-2017-0043117, filed on Apr. 3, 2017 in the Korean Intellectual Property Office, the contents of both of which are herein incorporated by reference in their entireties.

BACKGROUND

Embodiments of the present disclosure are directed, to a display device and a method of fabricating the same, and in particular, to a display device that can prevent interfacial separation between elements and has improved reliability, and a method of fabricating the same.

An organic light emitting display device includes an organic light emitting device which is composed of an anode, an organic light emitting layer, and a cathode. An organic light entitling layer is vulnerable to moisture or oxygen. In detail, if external moisture or oxygen infiltrates into an organic light emitting display device, the light emitting layer may deteriorate, and thus, various defects, such as dark spots or pixel shrinkage, can occur. Accordingly, am encapsulation structure is used to protect an organic light emitting device from external moisture or oxygen.

SUMMARY

Some embodiments of the inventive concept provide a display device that can prevent extraneous material, such as oxygen or moisture, from infiltrating therein and thereby to have improved reliability.

Some embodiments of the in entire concept provide a method of fabricating a display device, including forming layers of an encapsulation structure through a continuous process to allow the layers to have improved adhesive characteristics.

According to some embodiments of the inventive concept, a display device includes an organic light emitting device and an encapsulation structure disposed on the organic light emitting device that seals the organic, light emitting device. The encapsulation structure includes a first inorganic encapsulation layer disposed on the organic light emitting device, a first organic layer disposed on the first inorganic encapsulation layer and a second organic layer disposed on the first organic layer, and a second inorganic encapsulation layer disposed on the second organic layer atomic ratio of carbon to silicon in the first organic layer is less than an atomic ratio of carbon to silicon in the second organic layer.

In some embodiments, the atomic ratio of carbon to silicon in the first organic layer is less than 1.24, and the atomic ratio of carbon to silicon in the second organic layer is greater than 1.24.

In some embodiments, the atomic ratio of carbon to silicon in the first organic layer ranges from 1.20 to 1.24, and the atomic ratio of carbon to silicon in the second organic layer ranges from 1.24 to 1.30.

In some embodiments, the first and second organic layers include a silicone-based compound that includes silicon-oxygen chains.

In some embodiments, an atomic ratio of oxygen to silicon in the first organic layer is greater than an atomic, ratio of oxygen to silicon in the second organic layer.

In some embodiments, the atomic ratio of oxygen to silicon in the first organic layer is greater than 0.62, and the atomic ratio of oxygen to silicon in the second organic layer is less than 0.62.

In some embodiments, the atomic ratio of oxygen to silicon in the first organic layer ranges from 0.62 to 0.64, and the atomic ratio of oxy oxygen to silicon in the second organic layer ranges from 0.60 to 0.62.

In some embodiments, the display device further includes an intermediate organic layer disposed between the first organic layer and the second organic layer, an atomic ratio of oxygen to silicon in the intermediate organic layer may have a value between those in the first organic layer and the second organic layer.

In some embodiments, the atomic ratio of carbon to silicon in the first organic layer increases with decreasing distance from the second organic layer.

In some embodiments, the atop is ratio of oxygen to silicon in the first organic layer increases with decreasing distance from the first inorganic encapsulation layer.

According to some embodiments of the inventive concept, a display device includes an organic light emitting device, a first inorganic layer disposed on the organic light emitting device, a first organic layer disposed directly on the first inorganic layer, a second organic layer disposed directly on the first organic layer, and a second inorganic layer disposed directly on the second organic layer. An atomic ratio of carbon to silicon in the first organic layer is less than an atomic ratio of carbon to silicon in the second organic layer.

In some embodiments, the first and second organic layers each include a silicone-based compound that includes silicon-oxygen chains, and an atomic ratio of oxygen to silicon in the first organic layer is greater than an atomic ratio of oxygen to silicon in the second organic layer.

In some embodiments, the atomic ratio of carbon to silicon in the first organic layer ranges from 1.20 to 1.24 and increases with decreasing distance from the second organic layer, and the atomic ratio of carbon to silicon in the second organic layer ranges from 1.24 to 1.30. The atomic ratio of oxygen to silicon in the first organic layer ranges from 0.62 to 0.64 and increases with decreasing distance from the first inorganic layer, and the atomic ratio of oxygen to silicon in the second organic layer ranges from 0.60 to 0.62.

According to some embodiments of the inventive concept, a method of fabricating a display device includes preparing an organic light emitting device, depositing an inorganic material on the organic light emitting device to form a first inorganic encapsulation layer, forming an organic layer on the first inorganic encapsulation layer, and depositing an inorganic material on the organic layer to form a second inorganic encapsulation layer. Forming the organic layer includes depositing an organic material under a first oxygen partial pressure to form a first organic layer on the first inorganic encapsulation layer and depositing an organic material under a second oxygen partial pressure that is less than the first oxygen partial pressure to form a second organic layer on the first organic layer.

In some embodiments, forming the organic layer may further include oxidizing the organic materials, and the organic material in forming the first organic layer is more actively oxidized than that in forming the second organic layer.

In some embodiments, the forming of the first organic layer and the forming of the second organic layer are continuous processes.

In some embodiments, the first organic layer is formed while gradually decreasing the first oxygen partial pressure.

In some embodiments, the organic material includes alkoxysilane-based compounds or siloxane-based compounds.

In some embodiments, the first organic layer and the second organic layer are formed of the same organic material.

DETAILED DESCRIPTION

Figure 1A:
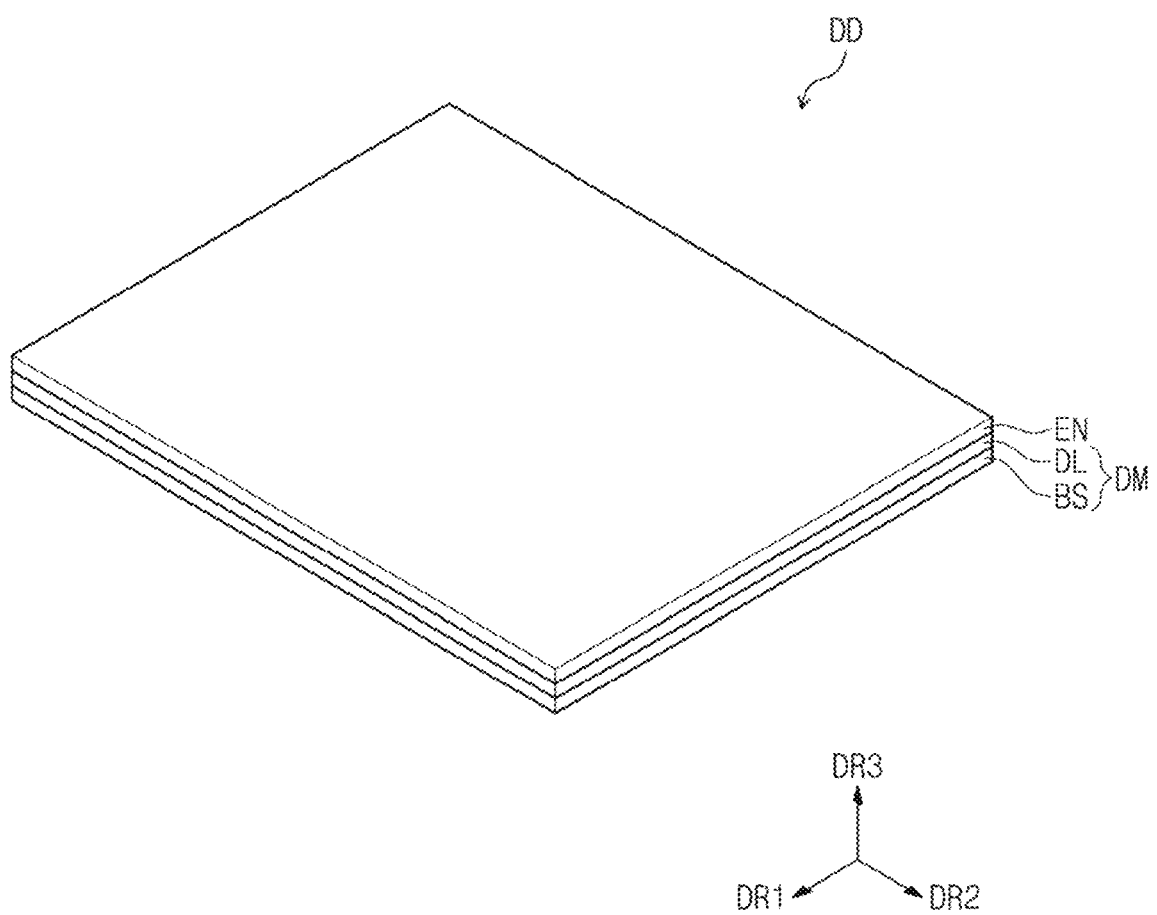
FIG. 1A is a perspective view of an assembled shape of a display device according to some embodiments of the inventive concept.

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein. In the drawings, the thicknesses of layers and regions gray be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present. Like numbers may indicate like elements throughout.

Figure 1B:
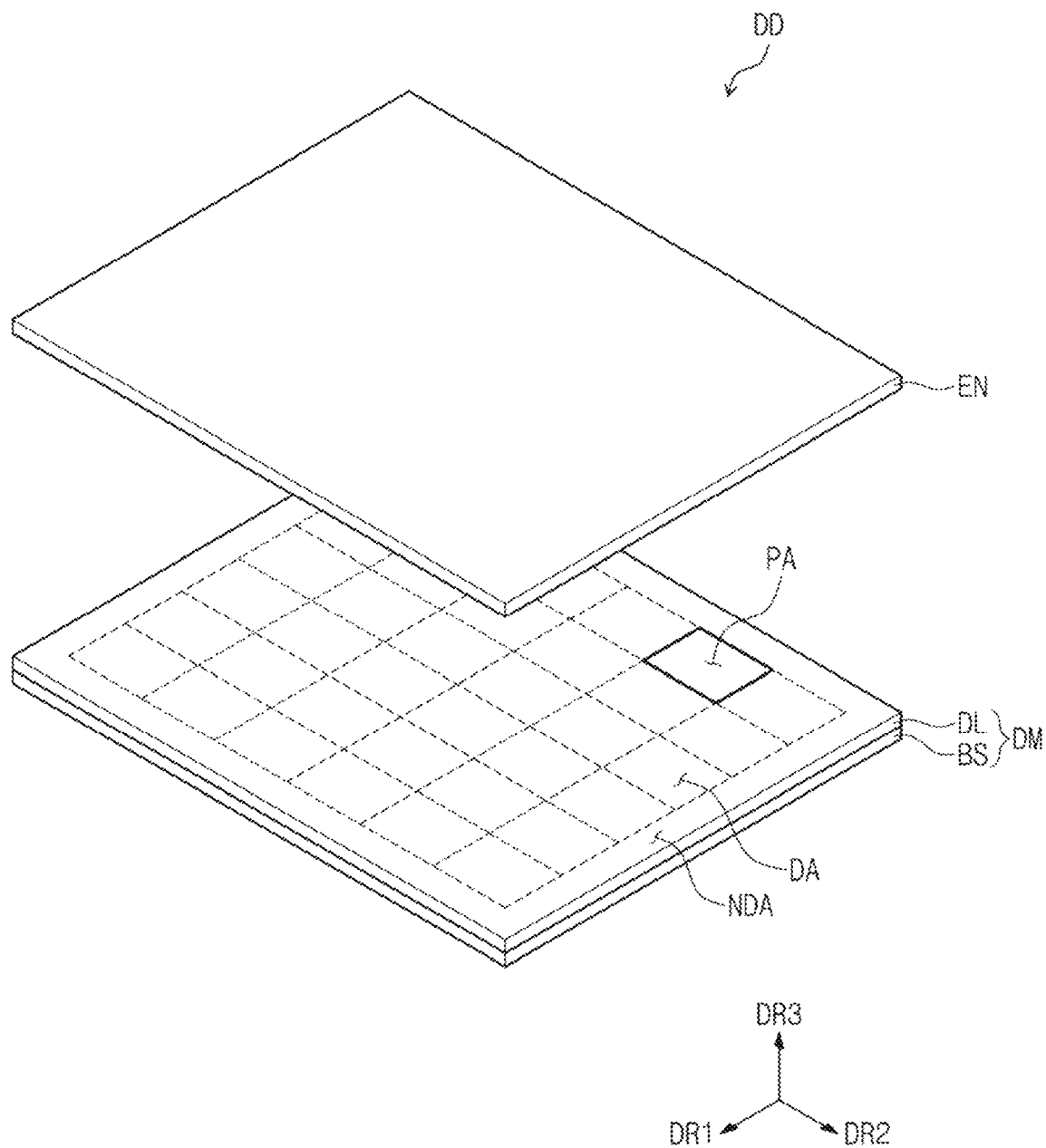
FIG. 1B is an exploded, perspective view of a display device according to some embodiments of the inventive concept.
Figure 2:
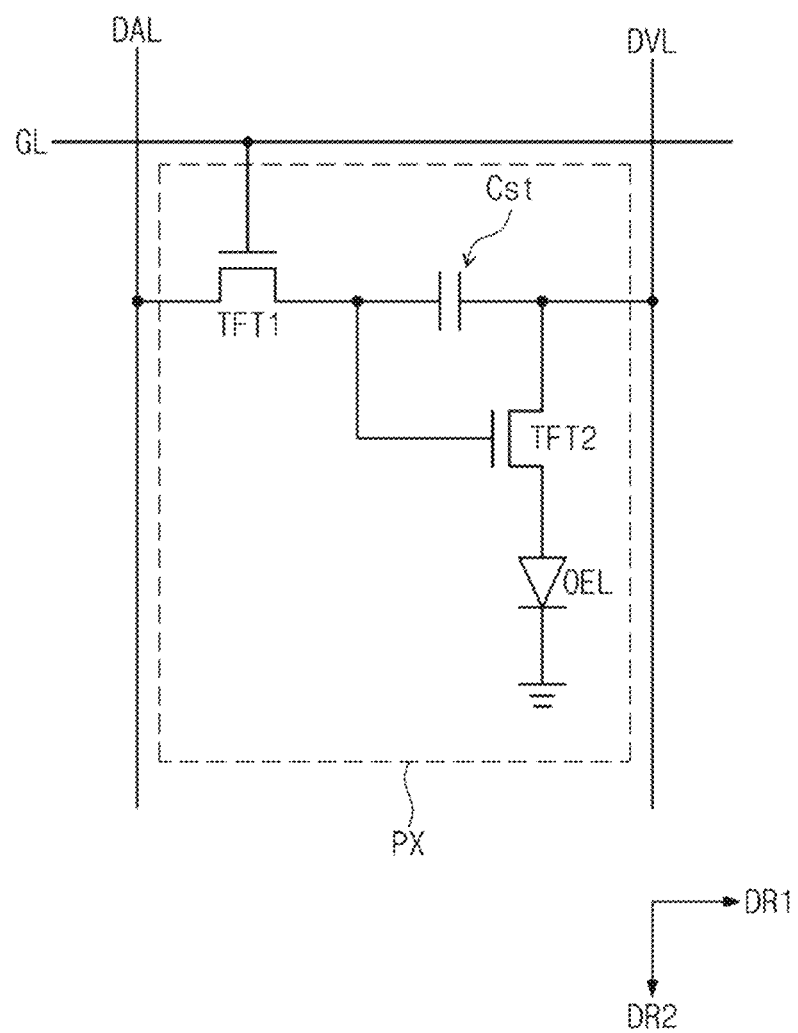
FIG. 2 is a circuit diagram of a pixel in a display device according to some embodiments of the inventive concept.

FIG. 1A is a perspective view of an assembled shape of a display device according to some embodiments of the inventive concept. FIG. 1B is an exploded perspective view of a display device according to some embodiments of the inventive concept. FIG. 2 is a circuit diagram of a pixel in a display device according to some embodiments of the inventive concept. Hereinafter, a display device DD according to some embodiments of the inventive concept will be described with respect to FIGS. 1A to 2.

Referring to FIGS. 1A and 1B, a display device DD according to some embodiments of the inventive concept includes a display structure DM and an encapsulation structure EN.

According to some embodiments, the display structure DM includes a display region DA and a non-display region NDA. The display region DA can display an image. When viewed from a thickness direction DR3 of the display device DD, the display region DA has a roughly rectangular shape, but embodiments of the inventive concept are not limited thereto.

According to some embodiments, the display region DA includes a plurality of pixel regions PA. The pixel regions PA are arranged in a matrix configuration. The pixel regions PA are defined by a pixel definition layer PDL (e.g., see FIG. 3). The pixel regions PA include a plurality of pixels PX (e.g., see FIG. 2). Each of the pixels PX includes an organic light emitting device OEL (e.g., see FIG. 3).

According to some embodiments, the non-display region NDA does not display an image. When viewed from the thickness direction DR3 of the display device DD, the non-display region NDA surrounds and encloses the display region DA. The non-display region NDA is, adjacent to the display region DA in a first direction DR1 and a second direction DR2 that crosses the first direction DR1.

According to some embodiments, the display structure DM includes a base structure BS and a display layer DL disposed on the base structure BS.

According to some embodiments, the base structure BS is a substrate formed from an insulating material, such as glass, plastic, or quartz. The display layer DL includes a plurality of pixels. Each of the pixels PX can emit light, based on electrical signals applied thereto.

Referring to FIG. 2, according to some embodiments, each of the pixels PX is part of an interconnection structure that includes a gate line GL, a data line DAL, and a driving voltage line DVL. Each of the pixels PX includes thin-film transistors TFT1 and TFT2, an organic light emitting device OEL and a capacitor Cst, which are connected to the thin-film transistors TFT1 and TFT2.

According to some embodiments, the gate line GL extends in the first direction DR1. The data line DAL extends in the second direction DR2, crossing the gate line GL. The driving voltage line DVL extends in substantially the same direction as that of the data line DAL, i.e., in the second direction DR2. The gate line GL transmits scan signals to the thin-film transistors TFT1 and TFT2 the data line DAL transmits data signals to the thin-film transistors TFT1 and TFT2, and the driving voltage line DVL transmits a driving voltage to the thin-film transistors TFT1 and TFT2.

According to some embodiments, the thin-film transistors TFT1 and TFT2 includes a driving thin-film transistor TFT2, which controls the organic light emitting device OEL, and a switching thin-film transistor TFT1, which controls a switching operation of the driving thin-film transistor TFT2. As described above, each of the pixels PX includes two thin-film transistors TFT1 and TFT2, but embodiments of the inventive concept are not limited thereto. For example, each of the pixels PX may include a single thin-film transistor and a single capacitor. In certain embodiments, each of the pixels PX includes three or more thin-film transistors and two or more capacitors.

According to some embodiments, the switching thin-film transistor TFT1 includes a first gate electrode, a first source electrode, and a first drain electrode. The first gate electrode is connected to the gate line GL, and the first source electrode is connected to the data line DAL. The first drain electrode is connected to, a first common electrode through a contact hole. The switching thin-film transistor TFT1 transmits a data signal which is applied to the data line DAL or to the driving thin-film transistor TFT2, depending on a scan signal applied to the gate line GL.

According to some embodiments, the organic light emitting device OEL includes a first electrode connected to the driving thin-film transistor TFT2, and a second electrode that receives a second power voltage. The organic light emitting device OEL includes a light-emitting pattern disposed between a first electrode and a second electrode.

According to some embodiments, the organic light emitting device OEL emits light when the driving thin-film transistor TFT2 is turned-on. Color, i.e., wavelength, of light emitted from the organic light emitting device OEL is determined depending on the kind of material used for the light-emitting pattern. For example, the organic light emitting device GEL can emit light whose color is one of red, green, blue, or white.

Referring back to FIGS. 1A and 1B, according to some embodiments, the encapsulation structure EN is disposed on the display structure DM. The encapsulation structure EN covers the display layer DL. The encapsulation structure EN protects the display layer DL against external moisture or a contamination material. The encapsulation structure EN will be described in more detail below.

Figure 3:
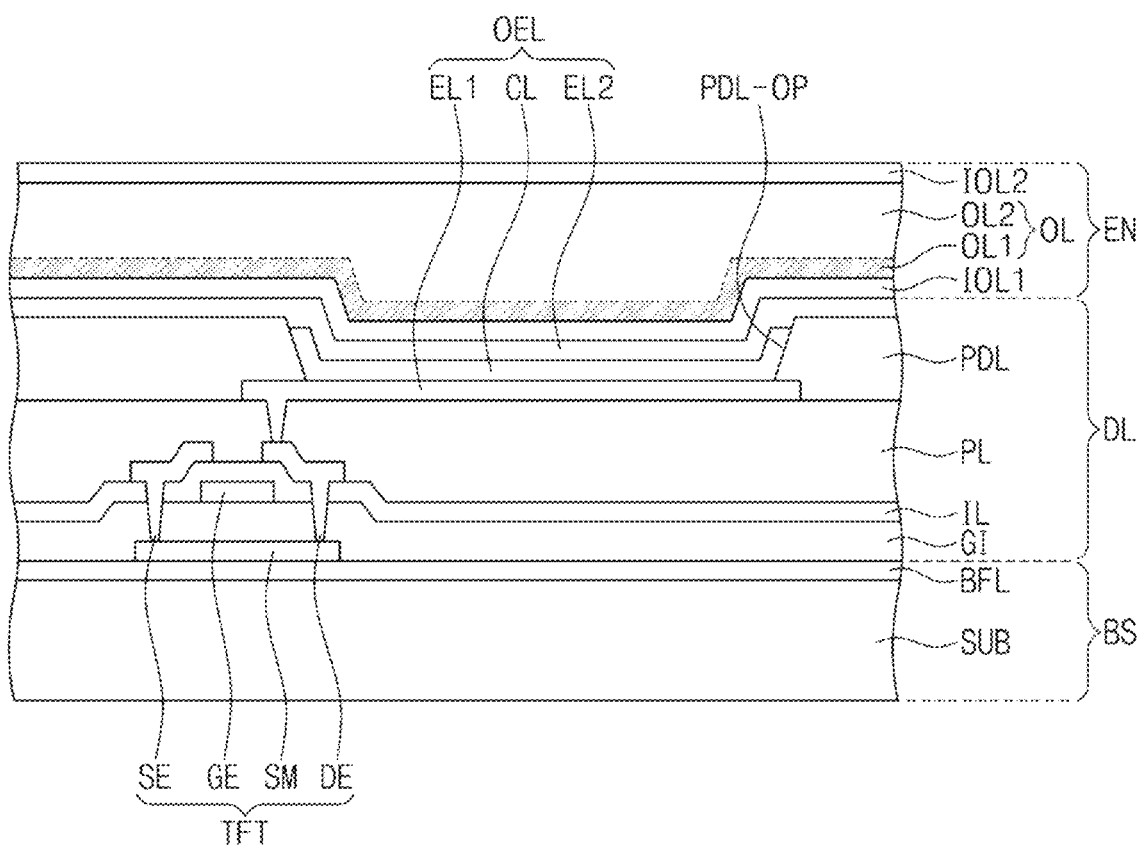
FIG. 3 is a vertical sectional view of a portion of a display device according to some embodiments of the inventive concept.
Figure 4A:
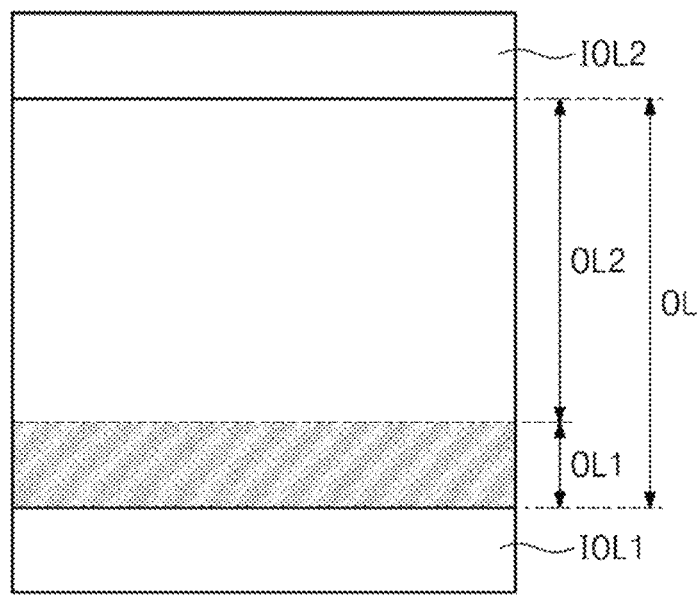
FIGS. 4A and 4B are vertical sectional views of a portion of an encapsulation structure in a display device of FIG. 3.
Figure 4B:
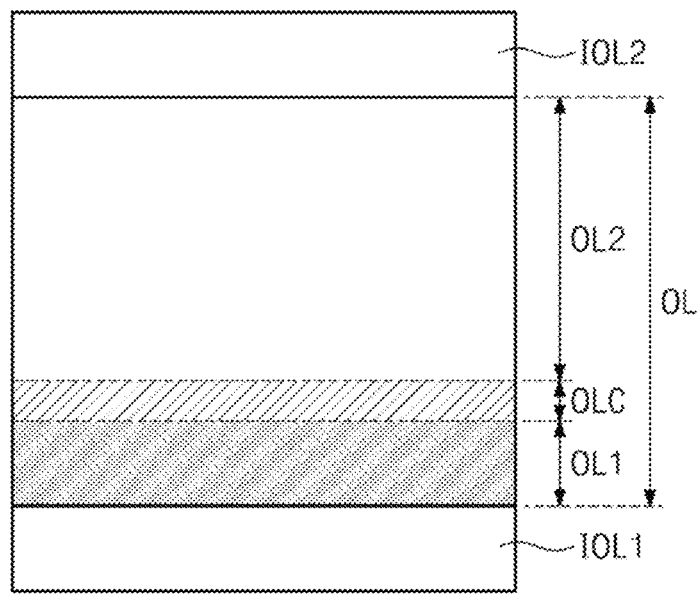

FIG. 3 is a vertical sectional view of a portion of a display device according to some embodiments of the inventive concept FIGS. 4A and 4B are vertical sectional views of a portion of an encapsulation structure in a display device of FIG. 3.

Referring to FIG. 3, according to some embodiments, a display device includes the base structure BS, the display layer DL, and the encapsulation structure EN.

According to some embodiments, the base structure BS includes a base layer SUB and a buffer layer BFL. The base layer SUB is formed of or includes at least insulating material, such as glass, plastic, quartz, etc., but embodiments of the inventive concept are not limited thereto. The base layer SUB includes an organic polymer, such as polyethylene terephthalate (PET), polyethylene naphthalate (PEN), polyimide, or polyether sulfone. The material for the base layer SUB is selected based on a desired mechanical strength, thermal stability, transparency, surface flatness, tractability, waterproofing property, etc.

According to some embodiments, a functional layer is disposed on the base layer SUB. Although in FIG. 3 the buffer layer BFL is illustrated as the functional layer, the functional layer can include a barrier layer. The buffer layer BFL robustly couples the base structure BS to the display layer DL, and the barrier layer can prevent contamination material from infiltrating into the display layer DL.

According to some embodiments, the display layer DL includes a thin-film transistor TFT and an organic light emitting device OEL.

According to some embodiments, the thin-film transistor TFT includes a driving thin-film transistor which controls the organic light emitting device OEL, and a switching thin-film transistor which controls the switching operation of the driving thin-film transistor.

According to some embodiments, the thin-film transistor TFT includes a semiconductor layer SM, a gate electrode GE, a source electrode SE, and a drain electrode DE. The semiconductor layer SM is formed of a semiconductor material and functions as an active layer of the thin-film transistor TFT. The semiconductor layer SM is formed from or includes at least one of an inorganic or an organic semiconductor material.

According to some embodiments, a gate insulating layer GI is disposed on the semiconductor layer SM. The gate insulating layer GI covers the semiconductor layer SM. The gate insulating layer GI includes at least one of an organic insulating material or an inorganic insulating material.

According to some embodiments, the gate electrode GE is disposed on the gate insulating layer GI. The gate electrode GE covers a region of the gate insulating layer GI that corresponds to a channel region of the semiconductor layer SM.

According to some embodiments, the source electrode SE and the drain electrode DE are disposed on an interlayer insulating layer IL. The drain electrode DE is in contact with a drain region of the semiconductor layer SM through a contact hole that penetrates the gate insulating layer GI and the interlayer insulating layer IL, and the source electrode SE is in contact with a source region of the semiconductor layer SM through a contact hole that penetrates the gate insulating layer GI and the interlayer insulating layer IL.

According to some embodiments, a passivation layer PL is disposed on the source electrode SE, the drain electrode DE, and the interlayer insulating layer IL. The passivation layer PL protects the thin-film transistor TFT and serves as a planarization layer that provides a flat top surface.

According to some embodiments, the organic light emitting device OEL is disposed on the passivation layer PL.

According to some embodiments, the manic light emitting device OEL includes a first electrode EL1, a second electrode EL2 disposed on the first electrode EL1, and an intervening layer CL disposed between the first electrode EL1 and the second electrode EL2.

According to some embodiments, the first electrode EL1 functions as a pixel electrode or a positive terminal. The first electrode EL1 may be a transparent electrode, a transflective electrode, or a reflective electrode. The first electrode EL1 is formed from or includes at least one conductive compound that includes a metal, a metal alloy, or a metal oxide. The first electrode EL1 is formed from or includes a transparent metal oxide, such as indium tin oxide (ITO), indium zit oxide (IZO), zinc oxide (ZnO), or indium tin zinc oxide (ITZO). The first electrode EL1 is formed from or includes at least one of Ag, Mg, Cu, Al, Pt, Pd, Au, Ni, Nd, Ir, Cr, Li, Ca, LiF/Ca LiF/Al, Mo, Ti, compounds thereof, or mixtures thereof, such as a mixture of Ag and Mg. In certain embodiments, the first electrode EL1 has a multi-layered structure that includes a reflective or transflective layer formed from the above materials, and a transparent conductive layer formed from indium tin oxide (ITO), indium zinc oxide (IZO), zinc oxide (ZnO), or indium tin zinc oxide (ITZO).

According to some embodiments, the second electrode EL2 is used as a common electrode or a negative-type electrode. The second electrode EL2 may be a transparent electrode, a transflective electrode, or a reflective electrode. The second electrode EL2 is formed from or includes at least one conductive compound that includes a metal, a metal alloy, or a metal oxide. The second electrode EL2 is formed from or includes a transparent metal oxide, such as indium tin oxide (ITO), indium zinc oxide (IZO), zinc oxide (ZnO) or indium tin Zinc oxide (ITZO). The second electrode EL2 is formed from or includes at least one of Ag, Mg, Al, Pt, Pd, Au, Ni, Nd, Ir, Cr, Li, Ca, LiF/Ca, LiF/Al, Mo, Ti, compounds thereof, or mixtures thereof, such as a mixture of Ag and Mg. The second electrode EL2 may have a multi-layered structure that includes a reflective or transflective layer formed from at least one of the above materials, and a transparent conductive layer formed from indium tin oxide (ITO), indium zinc oxide (IZO), zinc oxide (ZnO), or indium tin zinc oxide (ITZO).

According to some embodiments, the first electrode EL1 is a reflective electrode, and the second electrode EL2 is a transflective electrode or a transparent electrode. In the organic light emitting display device DID according to some embodiments of the inventive concept, the organic light emitting device OEL is a top-emission type. However, embodiments of the inventive concept are not limited thereto, and for example, the organic light emitting device OEL may be of a bottom-emission type in other embodiments.

According to some embodiments, the pixel definition layer PDL is disposed on the first electrode EL1 For example, the pixel definition layer PDL covers a portion of the first electrode EL1 and exposes other portions of the first electrode EL1.

According to some embodiments, the pixel definition layer PDL has an opening PDL-OP. The opening PDL-OP of the pixel definition layer PDL defines a light-emitting region.

According to son e embodiments, the intervening layer CL is disposed between the first electrode EL1 and the second electrode EL2. The intervening layer CL includes a light emitting layer. The intervening layer CL further includes a plurality of common layers, in addition to the light emitting layer. For example, the intervening layer CL includes a hole injection layer, a bole transport layer, a light emitting layer, an electron transport layer, and an electron injection layer, which are sequentially stacked. In certain embodiments, the intervening layer CL further includes at least one of a hole blocking layer, a hole buffer layer, or an electron blocking layer.

According to some embodiments, the intervening layer CL is, disposed in the opening PDL-OP defined in the pixel definition layer PDL. The intervening layer. CL overlaps the light-emitting region defined by the opening PDL-OP of the pixel definition layer PDL.

According to some embodiments, the encapsulation structure EN includes a first inorganic layer IOL1, an organic layer OL disposed on the first inorganic layer IOL1, and, a second inorganic layer IOL2 disposed on the organic layer OL. The encapsulation structure EN is disposed on the organic light emitting device OEL and hermetically seals the organic light emitting device OEL.

According to some embodiments, the first inorganic layer IOL1 is disposed on the display structure DM. The first inorganic layer IOL1 is disposed on the organic light emitting device OEL. In detail, the first inorganic layer IOL1 is in contact with the second electrode EL2 of the organic light emitting device OEL. The first inorganic layer IOL1 overlaps the organic light emitting device OEL and the pixel definition layer PDL. The first inorganic layer IOL1 is formed from or includes an inorganic material. The inorganic material includes, for example, aluminum oxide, silicon oxide, silicon oxynitride, silicon nitride, zinc oxide, strontium oxide, titanium oxide, hafnium oxide, etc., but embodiments of the inventive concept are not limited thereto. The first inorganic layer IOL1 is a barrier layer that encapsulates the organic light emitting device OEL and prevents contamination materials from infiltrating into the organic light emitting device OEL. Hereinafter, for convenience in description, the first inorganic layer IOL1 is referred to as a first inorganic encapsulation layer IOL1.

According to some embodiments, the organic layer OL includes a first organic layer OL1 and a second organic layer OL2. The first organic layer OL1 is disposed adjacent to the first inorganic encapsulation layer IOL1, when viewed in a vertical section. For example, the first organic layer OL1 is in direct contact with the first inorganic encapsulation layer IOL1. The second organic layer OL2 is disposed on the first organic layer OL1. The second organic layer OL2 is in direct contact with the first organic layer OL1. The second organic layer OL2 is spaced apart from the first inorganic encapsulation layer IOL1 with the first organic layer OL1 interposed therebetween. The organic layer OL has a specific thickness, allowing it to be a protection layer that protects the organic light emitting device OEL and as a planarization layer that provides a flat top surface.

According to some embodiments, the second inorganic layer IOL2 is disposed cm the organic layer OL. The second inorganic layer IOL2 is in direct contact with the second organic layer OL2. The second inorganic layer IOL2 overlaps the organic light emitting device OEL and the pixel definition layer PDL. The second inorganic layer IOL2 fully overlaps the first inorganic encapsulation layer IOL1 when viewed in a plan view. The second inorganic layer IOL2 is formed from or includes an inorganic material. The second inorganic layer IOL2 includes the same inorganic material as that in the first inorganic encapsulation layer IOL1. The second inorganic layer IOL2 encapsulates the organic light emitting device OEL and prevents contamination materials from infiltrating into the organic light emitting device OEL. Hereinafter, for convenience in description, the second inorganic layer IOL2 will be referred to as a second inorganic encapsulation layer IOL2.

Referring to FIG. 4A, according to some embodiments, the organic layer OL includes the first organic layer OL1 and the second organic layer OL2. The first organic layer OL1 is disposed adjacent to the first inorganic encapsulation layer IOL1, when viewed in a vertical section. The second organic layer OL2 is disposed on the first organic layer OL1 and is spaced apart from the first inorganic encapsulation layer TOLL when viewed in a vertical section. The first organic layer OL1 has a thickness ranging from about 500 Å to about 4000 Å.

According tip some embodiments, the organic layer OL is formed from or includes at least one silicone-based organic compound. The organic layer OL includes an organic material that contains carbon and silicon. The organic layer OL includes an organic material that contains carbon, silicon, and oxygen. The organic layer OL includes a silicone-based compound that includes silicon-oxygen chains.

According to some embodiments, an atomic ratio of carbon to silicon in the first organic layer OL1 differs from an atomic ratio of carbon to silicon in the second organic layer OL2. The atomic ratio of carbon to silicon in the first organic layer OL1 is less than the atomic ratio of carbon to silicon in the second organic layer OL2. The first organic layer OL1 has a carbon content that is less than that of the second organic layer OL2 and has a silicon content that is greater than that of the second organic layer OL2.

According to some embodiments, the atomic ratio of carbon to silicon in the first organic layer OL1 is lower than about 1.24. In detail, the atomic ratio of carbon to silicon in the first organic layer OL1 ranges from about 1.20 to about 1.24. The atomic ratio of carbon to silicon in the second organic layer OL2 is greater than about 1.24. In detail, the atomic ratio of carbon to silicon in the second organic layer OL2 ranges from about 1.24 to about 1.30.

According to some embodiments, an atomic ratio of oxygen to silicon in the first organic layer OL1 differs from an atomic ratio of oxygen to silicon in the second organic layer OL2. For example, the atomic ratio of oxygen to silicon in the first organic layer OL1 is greater than the atomic ratio of oxygen to silicon in the second organic layer OL2. The first organic layer OL1 has an oxygen content less than that of the second organic layer OL2 and has a silicon content greater than that of the second organic layer OL2.

According to some embodiments, the atomic ratio of oxygen to silicon in the first organic layer OL1 is greater than about 0.62. In detail, the atomic ratio of carbon to silicon in the first organic layer OL1 ranges from about 0.62 to about 0.64. The atomic ratio of carbon to silicon in the second organic layer OL2 is less than about 0.62. In more detail, the atomic ratio of carbon to silicon in the second organic layer OL2 ranges from about 0.60 to about 0.62.

In some embodiments, the organic layer OL includes the first organic layer OL1 and the second organic layer OL2. The first organic layer OL1 and the second organic layer OL2 have different content ratios of carbon to silicon and oxygen to silicon. The first organic layer OL1 has a lower carbon content and a higher oxygen content as compared with the second organic layer OL2, and thus, the first organic layer OL1 has characteristics similar to the first inorganic encapsulation layer IOL1, compared with the second organic layer OL2. When compared with the second organic layer OL2, the first organic layer OL1 may have characteristics similar to an inorganic layer, and thus, has good adhesive characteristics to adhere to the first inorganic encapsulation layer IOL1.

In some embodiments, since the organic layer OL includes the first organic layer OL1, which behaves like an inorganic layer and is positioned adjacent to the first inorganic encapsulation layer IOL1, adhesive characteristics can be improved bet peen the first inorganic encapsulation layer IOL1 and the organic layer OL in the encapsulation structure EN. This can improve stability of the encapsulation structure EN and thereby to improve reliability of the display device DD.

Referring to FIG. 4B, according to some embodiments, the organic layer OL includes the first organic layer OL1, the second organic layer OL2, and an intermediate organic layer OLC disposed between the first organic layer OL1 and the second organic layer OL2. An atomic ratio of carbon to silicon in the intermediate organic layer OLC has an intermediate value between those in the first organic layer OL1 and the second organic layer OL2. An atomic ratio of oxygen to silicon in the intermediate organic layer OLC has an intermediate value between those in the first organic layer OL1 and the second organic layer OL2.

Referring to FIGS. 4A and 4B, according to some embodiments, content ratios of carbon and oxygen to silicon the first organic layer OL1 change in a thickness direction thereof. For example, the atomic ratio of carbon to silicon in the first organic layer OL1 increases with decreasing distance from the second organic layer OL2 and decreases with decreasing distance from the first inorganic encapsulation layer IOL1. The atomic ratio of oxygen to silicon in the first organic layer OL1 decreases with decreasing distance from the second organic layer OL2 and increases with decreasing distance from the first inorganic encapsulation layer IOL1.

In some embodiments, the first organic layer OL1 and the second organic layer OL2 are formed by a continuous process. Here, to realize the difference in ratios of carbon and oxygen to silicon between the first organic layer OL1 and the second organic layer OL2, a process condition changes during the continuous process. In certain embodiments, during the continuous process, the intermediate organic layer OLC is formed between the first organic layer OL1 and the second organic layer OL2. The intermediate organic layer OLC has an intermediate content ratio of carbon to silicon and oxygen to silicon, when compared with the first organic layer OL1 and the second organic layer OL2. During a process of forming the first organic layer OL1, the process condition gradually changes to change the ratios of carbon and oxygen to silicon in the first organic layer OL1 in a thickness direction thereof.

A method of fabricating a display device according to some embodiments of the inventive concept will be described in more detail below.

Figure 5A:
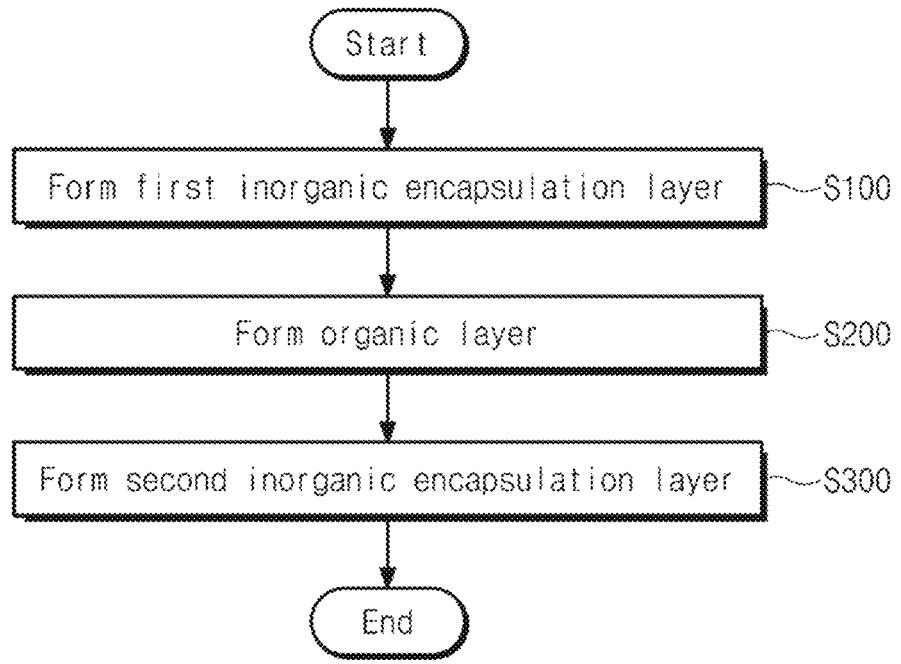
FIGS. 5A and 5B are flow charts of a process of fabricating a display device, according to some embodiments of the inventive concept.
Figure 5B:
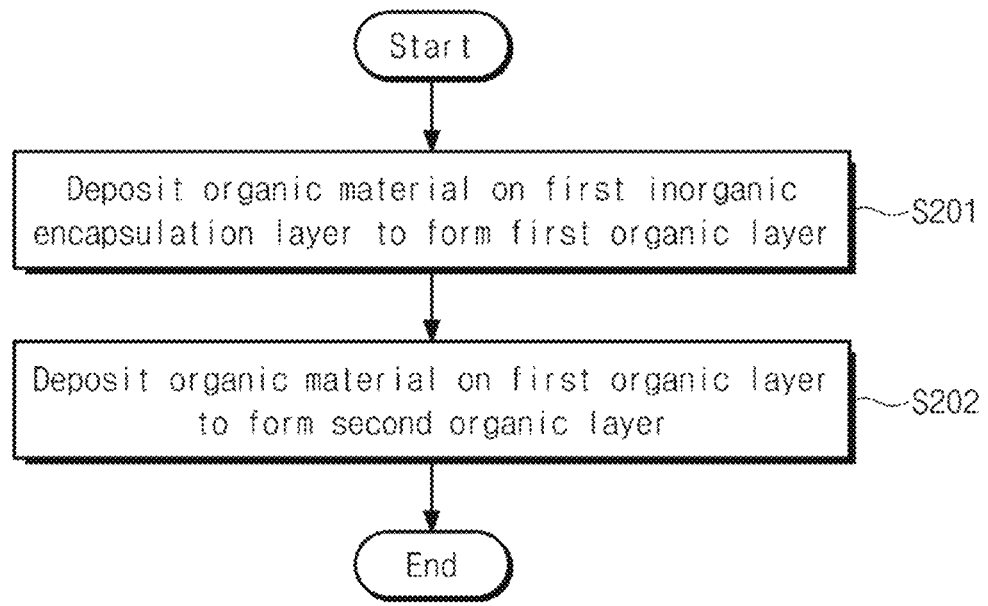

FIGS. 5A and 5B are flow charts of a process of fabricating a display device, according to some embodiments of the inventive concept. FIGS. 6A to 6F are sectional views that illustrate some steps of a process of fabricating a display device, according to some embodiments of the inventive concept.

A method of fabricating a display device according to some embodiments of the inventive concept includes preparing a display structure and forming an encapsulation structure on the display structure. The display structure includes an organic light emitting device, and the encapsulation structure is formed to hermetically seal the organic light emitting device.

FIG. 5A is a flow ohm of a process of forming the encapsulation structure, according to some embodiments of the inventive concept. Forming the encapsulation structure includes forming the first inorganic encapsulation layer IOL1 (step S100), forming the organic layer OL (step S200), and forming the second inorganic encapsulation layer IOL2 (step S300). FIG. 5B is a flow chart of a process of forming the organic layer, according, to some embodiments of the inventive concept. Forming the organic layer includes depositing an organic material OM on the first inorganic encapsulation layer IOL1 to form the first organic layer OL1 (step 201) and then depositing the organic material OM on the first organic layer OL1 to form the second organic layer OL2 (step 202).

Figure 6A:
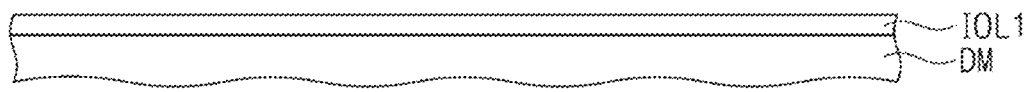
FIGS. 6A to 6F are sectional views that illustrate a process of fabricating a display device, according to some embodiments of the inventive concept.
Figure 6B:
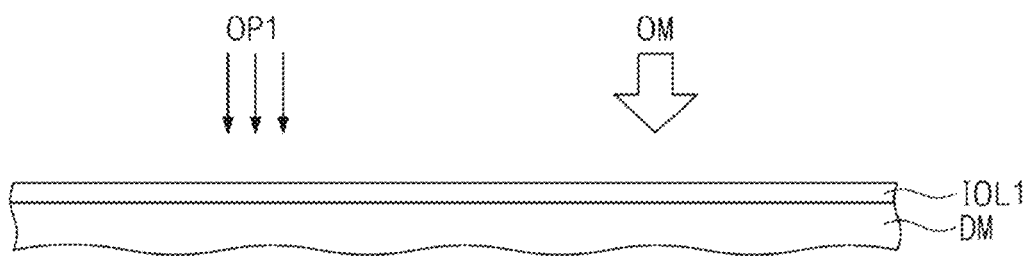
Figure 6C:
Figure 6D:
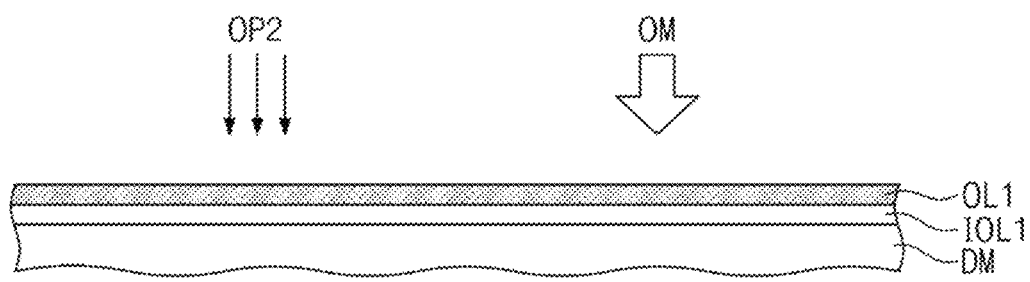
Figure 6E:

Referring to FIG. 6A, according to some embodiments, forming the encapsulation structure includes preparing the display structure DM and depositing an inorganic material on the display structure DM to form the first inorganic encapsulation layer IOL1 (step S100). They, first inorganic encapsulation layer IOL1 can be formed by a chemical vapor deposition (CVD) method, but embodiments of the inventive concept are not limited thereto.

Referring to FIGS. 6B to 6E, forming the encapsulation structure further includes forming the organic layer OL on the first inorganic encapsulation layer IOL1 (step S200). Forming the organic layer OL (step S200) includes depositing an organic material OM on the first inorganic encapsulation layer IOL1 to form the first organic layer OL1 (step 201) and then depositing the organic material OM on the first organic layer OL1 to form the second organic layer OL2 (step 202).

According to some embodiments, the first organic layer OL1 is formed on the first inorganic encapsulation layer IOL1 by depositing the organic material OM under a first oxygen partial pressure OP1. The organic material OM is formed from or includes alkoxysilane-based compounds or siloxane-based compounds. However, embodiments of the inventive concept are not limited thereto, and in certain embodiments, the organic material OM is formed from or includes at least one of hexamethyldisiloxane (HMDSO), tetraethyl orthosilicate (TEOS), diethoxymethylsilane (DEMS), or N-octyltrimethoxysilane (OCTMS).

According to some embodiments, forming the first organic layer OL1 includes oxidizing the organic material OM under the process conditions of the first oxygen partial pressure OP1. For example, the organic material OM is decomposed by an electron beam and then oxidized under the process conditions of the first oxygen partial pressure OP1.

According to some embodiments, the second organic layer OL2 is formed on the first organic layer OL1 by depositing the organic material OM under a second oxygen partial pressure OP2. The second organic layer OL2 is formed in a continuous or ion-interrupted manner after the first organic layer OL1 is formed.

According to some embodiments, the organic material OM, which is used to form the second organic layer OL2, includes alkoxysilane-based compounds or siloxane-based compounds. The organic material OM used to form the second organic layer OL2 is the same as that used to from the first organic layer OL1. The same deposition material is used in the processes of forming the first and second organic layers OL1 and OL2, but the processes of forming the first and second organic layers OL1 and OL2 are performed under different process conditions, i.e., with different oxygen partial pressures.

According to some embodiments, the second oxygen partial pressure OP2 is less than the first oxygen partial pressure OP1. Forming the second organic layer OL2 includes oxidizing the organic material OM under the process conditions of the second oxygen partial pressure OP2. Since the second oxygen partial pressure OP2 is less than the first oxygen partial pressure OP1, the organic material OM more actively oxidizes during the formation of the first organic layer OL1 than during the formation of the second organic layer OL2. Since the organic material OM oxidizes more actively in the formation of the first organic layer OL1, the first organic layer OL1 has a greater content ratio of oxygen to silicon and a lower content ratio of carbon to silicon than the second organic layer OL2.

According to some embodiments, the first organic layer OL1 is formed while changing the first oxygen partial pressure OP1. The first organic layer OL1 is formed while gradually decreasing the first oxygen partial pressure OP1. In this case, the first organic layer OL1 is formed to have content ratios of carbon and oxygen to silicon that vary in a thickness direction of the first organic layer OL1. In detail, the atomic ratio of carbon to silicon in the first organic layer OL1 decreases with decreasing distance from the first inorganic encapsulation layer IOL1. The atomic ratio of oxygen to silicon in the first organic layer OL1 increases with decreasing distance from the first inorganic encapsulation layer IOL1.

Figure 6F:

Referring to FIG. 6F, according to some embodiments, forming the encapsulation structure includes depositing an inorganic material on the organic layer OL to form the second inorganic encapsulation layer IOL2 (step S300). The second inorganic encapsulation layer IOL2 can be formed by a chemical vapor deposition (CVD) method, but embodiments of the inventive concept are not limited thereto.

In a method of fabricating a display device according to some embodiments of the inventive concept, the second organic layer OL2 is formed in a continuous or non-interrupted manner after the first organic layer OL1 is formed. The same deposition material are used to form the first and second organic layers OL1 and OL2, but the processes of forming the first and second organic layers OL1 and OL2 are performed under different process conditions, e.g., by varying the oxygen partial pressure or voltage. In the method of fabricating a display device, since the first and second organic layers OL1 and OL2, whose compositions differ from each other, are formed by a continuous process, the number of process steps for fabricating a display device can be reduced, thereby reducing process costs. Furthermore, stability of the encapsulation structure and reliability of a display device can be improved.

Hereinafter, some experimental examples of embodiments of the inventive concept will be described in detail. Some embodiments to be described below are presented to provide better understanding of the inventive concept, beat embodiments of the inventive concept are not limited thereto.

Figure 7A:
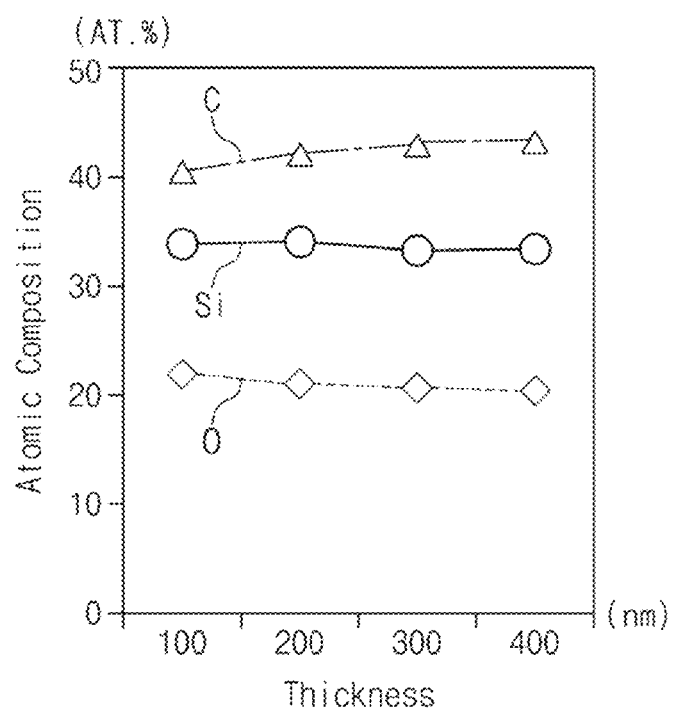
FIG. 7A is a graph of the atomic composition of a first organic layer according to some embodiments of the inventive concept.

FIG. 7A is a graph of the atomic composition of a first organic layer according to some embodiments of the inventive concept. FIG. 78 is a graph of the atomic composition of a second organic layer according to some embodiments of the inventive concept. Data shown in FIGS. 7A and 78 were measured through an X-ray photoelectron spectroscopic (XPS) analysis.

Figure 7B:
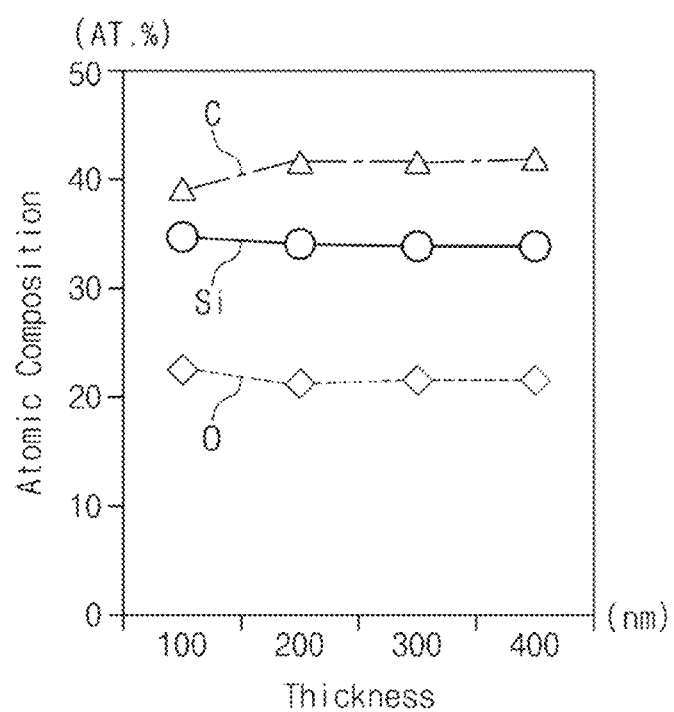
FIG. 7B is a graph of the atomic composition of a second organic layer according to some embodiments of the inventive concept.

In FIGS. 7A and 7B, according to some embodiments, the x axis represents a thickness of each layer, and the y axis represents atomic percent values. Referring to FIGS. 7A and 7B, there was no difference in composition between the first and second organic layers, the first organic layer had a relatively higher oxygen atomic percent, and the second organic layer had a relatively higher carbon atomic percent.

Figure 8A:
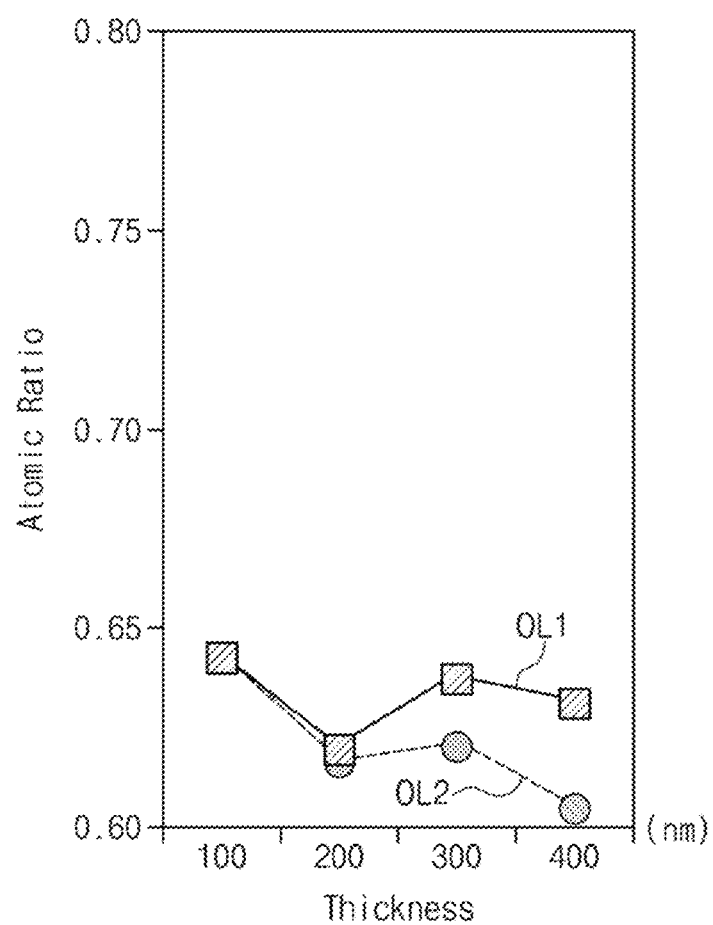
FIG. 8A is a graph that compares atomic ratios of oxygen to silicon in first and second organic layers according to some embodiments of the inventive concept.
Figure 8B:
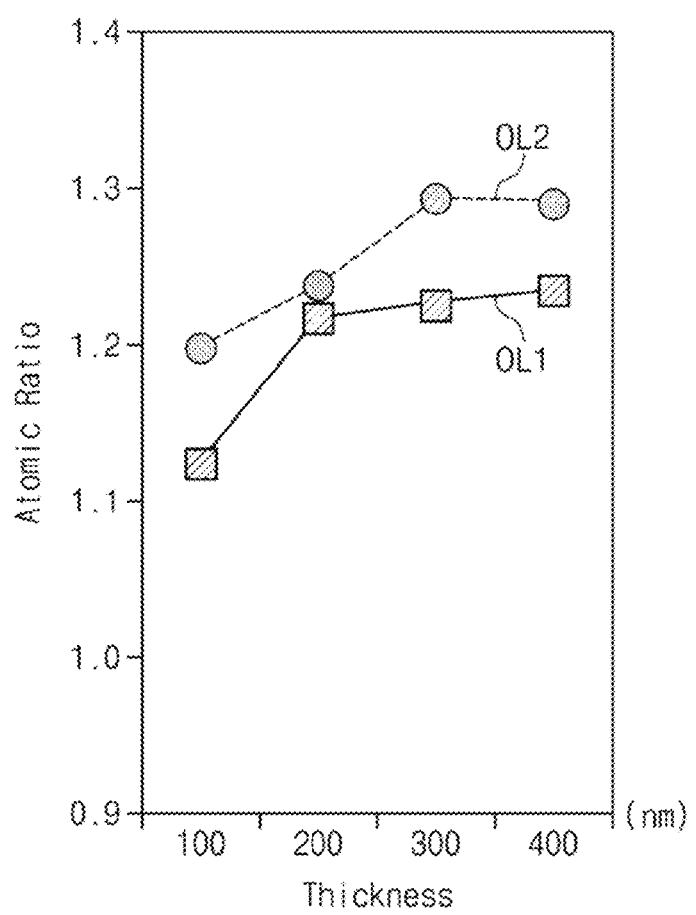
FIG. 8B is a graph that compares atomic ratios of carbon to silicon in first and second organic layers according to some embodiments of the inventive concept.

FIG. 8A is a graph that compares atomic ratios of oxygen to silicon in first and second organic layers according to some embodiments of the inventive concept. FIG. 8B is a graph that compares atomic ratios of carbon to silicon in first and second organic layers according to some embodiments of the inventive concept.

Referring to FIG. 8A, the first organic layer had a higher atomic ratio of oxygen to silicon than the second organic layer. As a result of a surface oxidation, the atomic ratio of oxygen to silicon in the first organic layer was similar to that in the second organic layer, at a relatively shallow depth, e.g., about 100 nm, but the atomic ratio of oxygen to silicon in the first organic layer was greater than that m the second organic layer, with increasing depth.

Referring to FIG. 8B, the first organic layer had a greater atomic ratio of carbon to silicon than the second organic layer.

Figure 9A:
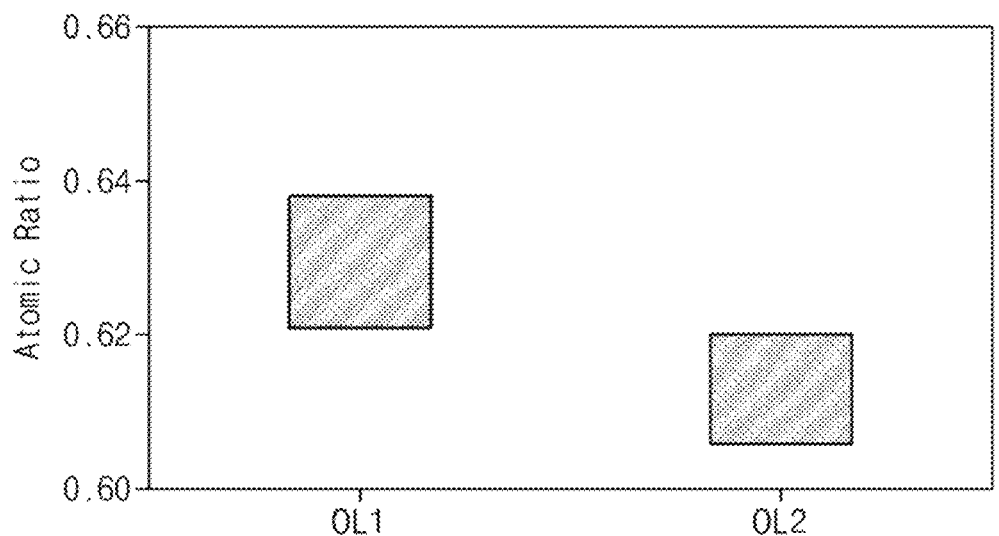
FIG. 9A is a graph that compares atomic ratio ranges of oxygen to silicon in first and second organic layers according to some embodiments of the inventive concept.
Figure 9B:
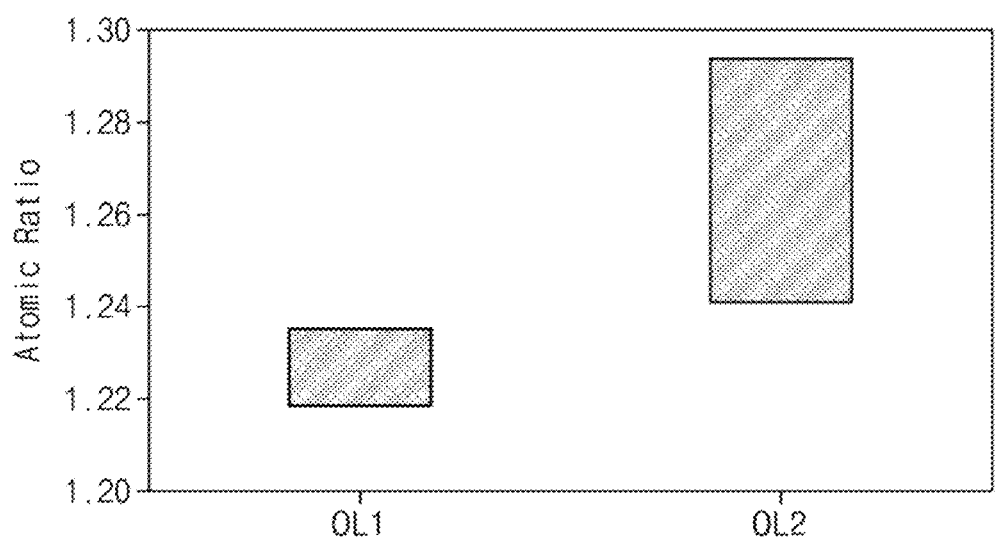
FIG. 9B is a graph that compares atomic ratio ranges of carbon to silicon in first and second organic layers according to some embodiments of the inventive concept.

FIG. 9A is a graph that compares atomic ratio ranges of oxygen to silicon in first and second organic layers according to some embodiments of the inventive concept. FIG. 9B is a graph that illustrates atomic ratio ranges of carbon to silicon in first and second organic layers according to some embodiments of the inventive concept.

Referring to FIGS. 9A and 9B, an atomic ratio of oxygen to silicon in the first organic layer ranges from about 0.62 to about 0.64. An atomic ratio of carbon to silicon in the first organic layer ranges from about 1.20 to about 1.24. An atomic ratio of oxygen to silicon in the second organic layer ranges from about 0.60 to about 0.62. An atomic ratio of carbon to silicon in the second organic layer ranges from about 1.24 to about 1.30.

According to some embodiments of the inventive concept, since the first and second organic layers are formed by depositing the same material under different process conditions, e.g., in terms of oxygen partial pressure or voltage, differences in atomic ratios of oxygen and carbon to silicon between the first and second organic layers are be large, but the first organic layer has a higher oxygen atomic percent and a lower carbon atomic percent, as compared with the second organic layer.

Figure 10A:
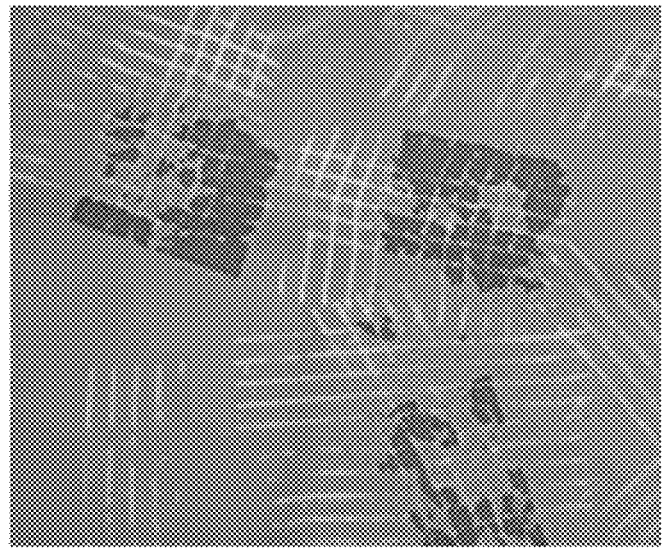
FIG. 10A is an image obtained from a surface scratch test performed on a display device according to some embodiments of the inventive concept.
Figure 10B:
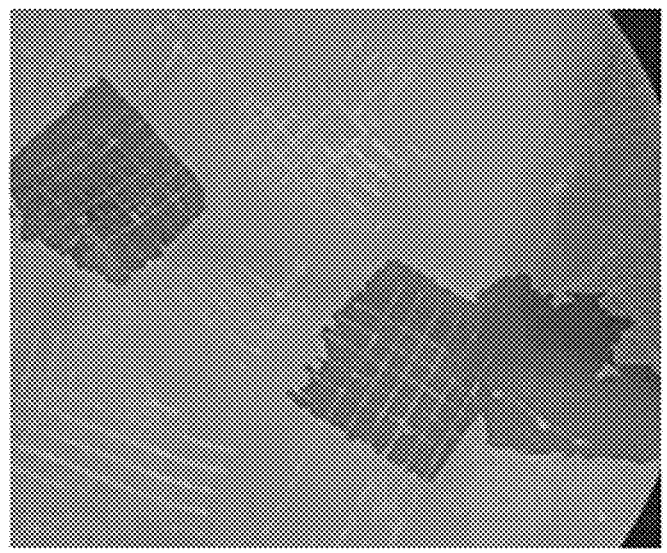
FIG. 10B is an image obtained from a surface scratch test performed on a display device according to a comparative example.

FIG. 10A is an image obtained from a surface scratch test performed on an encapsulation structure of a display device according to an exemplary embodiment of the inventive concept, and here, the encapsulation structure was prepared to include a first inorganic encapsulation layer, a first organic layer, a second organic layer, and a second inorganic encapsulation layer sequentially stacked in the order listed. FIG. 10B is an image obtained from a surface scratch test performed on an encapsulation structure of a display device according to a comparative example, and here, the encapsulation structure was prepared to have the same structure as that according to the inventive concept, except that no first organic layer was provided.

Referring to FIGS. 10A and 10B, according to some embodiments, the scratch test shows that an area of a region in which surface delamination occurs is larger in the comparative example than in an exemplary embodiment of the inventive concept. This result shows that the first organic layer, which is additionally provided in a display device according to an exemplary embodiment of the inventive concept that has a higher ratio of oxygen to silicon, can improve adhesive characteristics between the inorganic layer and the organic layer in the encapsulation structure, to prevent the display device from being broken by an external scratch, thus improving stability and reliability of the display device.

According to some embodiments of the inventive concept, a display device can effectively prevent an extraneous material, such as oxygen or moisture, from infiltrating therein, thereby improving reliability.

According to some embodiments of the inventive concept, a method of fabricating a display device includes forming layers of an encapsulation structure through a continuous process to improve adhesive characteristics of the layers, which can reduce fabrication costs of a display device.

While exemplary embodiments of the inventive concepts have been particularly shown and described, it will be understood by one of ordinary skill in the art that variations in form and detail may be made therein without departing from the spirit and scope of the attached claims.

What is claimed is:

1. A method of fabricating a display device, comprising:
   preparing a organic light emitting device;
   depositing an inorganic material on the organic light emitting device to form a first inorganic encapsulation layer;
   forming an organic layer on the first inorganic encapsulation layer; and
   depositing an inorganic material on the organic layer to, form a second inorganic encapsulation layer,
   wherein forming the organic layer comprises:
     depositing an organic, material under a first oxygen partial pressure to form a first organic layer on the first inorganic encapsulation layer; and
     depositing an organic material under a second oxygen partial pressure that is less than the first oxygen partial pressure to form a second organic layer on the first organic layer,
     wherein the first organic layer has a greater content ratio of oxygen to silicon and a lower content ratio of carbon to silicon than the second organic layer.

2. The method of claim 1, wherein forming the organic layer further comprises oxidizing the organic materials, and the organic material in forming the first organic layer is more actively oxidized than that in forming the second organic layer.

3. The method of claim 1, wherein the forming of the first organic layer and the forming of the second organic layer are continuous processes.

4. The method of claim 3, wherein the first organic layer is formed while gradually decreasing the first oxygen partial pressure.

5. The method of claim 1, wherein the organic material comprises alkoxysilane-based compounds or siloxane-based compounds.

6. The method of claim 5, wherein the first organic layer and the second organic layer are formed of the same organic material.

* * * * *